United States Patent
Close et al.

(10) Patent No.: US 6,201,930 B1
(45) Date of Patent: Mar. 13, 2001

(54) CHIP REMOVAL AND REPLACEMENT SYSTEM

(75) Inventors: Seth Close, San Francisco; Mike Carlomagno, Chico; Raymond Lui, Foster City; Jeff Wallingford, Redwood City, all of CA (US)

(73) Assignee: Metcal, Inc., Menlo Park, CA (US)

( * ) Notice: Subject to any disclaimer, the term of this patent is extended or adjusted under 35 U.S.C. 154(b) by 0 days.

(21) Appl. No.: 09/255,054

(22) Filed: Feb. 22, 1999

(51) Int. Cl.⁷ ....................................................... B23K 1/00
(52) U.S. Cl. ......................... 392/379; 239/391; 239/397; 228/191; 228/264
(58) Field of Search ..................................... 392/379–385, 392/360–369; 228/191, 264, 102; 239/390, 391, 397

(56) References Cited

U.S. PATENT DOCUMENTS

| | | |
|---|---|---|
| 4,230,250 | 10/1980 | Scheu, Jr. . |
| 4,289,953 | 9/1981 | Scheu, Jr. . |
| 4,295,596 | 10/1981 | Doten et al. . |
| 4,569,473 | 2/1986 | Guiliano . |
| 4,620,659 * | 11/1986 | Holdway .............................. 228/191 |
| 4,659,004 | 4/1987 | Fridman . |
| 4,752,025 | 6/1988 | Stach et al. . |
| 4,767,047 | 8/1988 | Todd et al. . |
| 4,787,548 * | 11/1988 | Abbagnaro et al. .................. 228/264 |
| 4,799,617 | 1/1989 | Friedman . |
| 4,832,249 | 5/1989 | Ehler . |
| 4,857,706 * | 8/1989 | Diamond ............................... 392/383 |
| 5,220,147 * | 6/1993 | Spigarelli et al. .................... 392/379 |
| 5,309,545 * | 5/1994 | Spigarelli et al. .................... 392/379 |
| 5,340,011 | 8/1994 | Sanchez . |
| 5,419,481 | 5/1995 | Lasto et al. . |
| 5,553,768 * | 9/1996 | Lasto et al. ........................... 228/102 |
| 5,560,531 | 10/1996 | Ruszowski . |
| 5,598,965 | 2/1997 | Scheu . |
| 5,735,450 | 4/1998 | Heim et al. . |

FOREIGN PATENT DOCUMENTS

| | | |
|---|---|---|
| 2657929 * | 7/1979 | (DE) . |
| 2925347 * | 1/1981 | (DE) ..................................... 228/264 |
| 2186222 | 8/1987 | (GB) . |
| 2234461 * | 2/1991 | (GB) ..................................... 228/264 |
| 10-24116 * | 1/1998 | (JP) . |

\* cited by examiner

Primary Examiner—John A. Jeffery
(74) Attorney, Agent, or Firm—Burns, Doane, Swecker & Mathis, L.L.P.

(57) ABSTRACT

A chip removal and replacement system is designed for safely and easily removing or reattaching components from a printed circuit board. The system includes an automatic suction system for lifting a component which has been removed. A nozzle connection and replacement mechanism is provided for interchanging nozzles. The system is also provided with an improved circuit board holder, a circuit board auxiliary preheater, and a simplified control system with one touch removal and replacement.

4 Claims, 7 Drawing Sheets

CHIP REMOVAL AND REPLACEMENT SYSTEM

BACKGROUND OF THE INVENTION

1. Field of the Invention

The invention relates to an apparatus for separating and removing integrated circuit chips from circuit boards and for replacing the integrated circuit chips, and more particularly, the invention relates to a system including a heating device for generating a flow of heated air, a circuit board holder for positioning a circuit board during chip removal, and a auxiliary preheater for heating the circuit board.

2. Brief Description of the Related Art

Hot gas desoldering tools are known for removing integrated circuit chips from circuit boards. Generally these tools direct a jet of hot gas at a component to melt the solder which connects the component leads to the circuit board. However, these known tools have a tendency to melt or otherwise damage the component being removed, the surrounding components, or the circuit board by overheating. These known desoldering tools have the additional disadvantage that they are difficult to adjust to a proper location and temperature and are generally difficult to use.

Integrated circuit chips that are to be removed may be traditional dual inline packages (DIP) with metal leads protruding from two sides, may have leads extending from all sides, or may be surface mount devices. Surface mount devices have leads at the perimeter of the device which are flush with the bottom surface of the device. Surface mount devices may also have connection points in the form of conductive pads on a bottom surface of the device allowing connection to the circuit board directly under the component. These surface mount devices allow the components to be more compact but are more difficult to remove without damage. It is desirable to be able to remove a variety of different component sizes and types with a single desoldering tool. Therefore, tools are provided with interchangeable nozzles for accommodating different chips. However, known tools with different nozzles do not provide systems for easily interchanging the nozzles even when hot. Accordingly, it would be desirable to provide a system of interchangeable nozzles which are easy to change.

Desoldering tools also may include a suction removal system for lifting a component off of the circuit board after the solder has been melted. However, these suction systems must be manually advanced into contact with the component risking component damage and adding an additional step for the user. Accordingly, it would be desirable to provide a fully automatic suction removal system for lifting a desoldered component off of a circuit board.

It would also be desirable to provide a system for desoldering which is easy to use, prevents damage to the circuit board or components, and easily accommodates components and circuit boards of different sizes and types.

SUMMARY OF THE INVENTION

The present invention relates to a safe and easily used system for removing and/or reattaching components, such as surface mount technology (SMT) components, from a printed circuit board.

In accordance with one aspect of the invention an automatic vacuum pickup system is provided for removing a component from a circuit board after desoldering. The system includes a desoldering device for directing a heated gas through a nozzle and focusing the gas to solder connection areas of a component on a circuit board to melt solder connections, a suction source connected to the desoldering device, a suction tip provided in the nozzle of the desoldering device for automatically applying suction to the component without manual lower of the suction tip, a suction path extending from the suction source to the suction tip, and a lifting device for applying a predetermined upward force to the suction tip after the application of the suction to the component, wherein the predetermined force is sufficient to lift the component after the solder connections have all been melted but insufficient to lift the component before all the solder connections have been melted.

In accordance with another aspect of the present invention, a desoldering tool includes a tool head, a heating element within the tool head, a fan for passing a gas over the heating element to provide a heated gas stream for desoldering of components from a circuit board, a nozzle removably connected to the tool head for directing the heated gas stream to the component to be removed, a nozzle connection on the tool head for receiving the nozzle, the nozzle connection including at least one spring element for forming a snap-in connection with the nozzle, and a nozzle release mechanism including a rotatable member which rotates about the axis of the nozzle to disengage the at least one spring element and release the nozzle.

In accordance with an additional aspect of the present invention, a desoldering tool includes a tool head, a heating element within the tool head, an adjustable speed fan for passing a gas over the heating element to provide a heated gas stream for desoldering of components from a circuit board, a nozzle for directing the heated gas stream to the component to be removed, a temperature sensor positioned to sense a temperature of the gas stream exiting the nozzle, and a controller for adjusting the speed of the fan based on an output of the temperature sensor to achieve a predetermined temperature for desoldering.

In accordance with a further aspect of the invention, a circuit board holder for positioning circuit boards during attachment or removal of components includes a frame for supporting the circuit board above a work surface, two parallel movable side rails supported on the frame and movable toward and away from one another to accommodate circuit boards of varying sizes, and at least two movable clips positioned on each of the movable side rails for grasping the circuit board, wherein the clips are movable along the rails to a position at which the clips can grasp the circuit board without contacting components on the circuit board.

According to another aspect of the invention, an auxiliary preheater is provided for warming a circuit board in preparation for removal of components from the circuit board. The auxiliary preheater includes a ceramic positive temperature coefficient heating element, and a variable speed fan for directing gas over the heating element toward a circuit board which is positioned above the auxiliary preheater.

In accordance with a further aspect of the invention, a method of controlling a desoldering tool includes the steps of:

providing a desoldering tool with a variable speed fan and a heating element;

providing a plurality of interchangeable nozzles for connection to the desoldering tool to direct heated gas over a component, each of the nozzles configured to provide an airflow profile for a particular size and type of component, the nozzles each having a coded portion which is recognized by the desoldering tool;

inserting one of the nozzles into the desoldering tool; and automatically setting an airflow profile of the fan based on the recognition of the coded portion of the nozzle by the desoldering tool.

BRIEF DESCRIPTION OF THE DRAWINGS

The invention will now be described in greater detail with reference to the preferred embodiments illustrated in the accompanying drawings, in which like elements bear like reference numerals, and wherein.

DETAILED DESCRIPTION OF THE PREFERRED EMBODIMENTS

The chip removal and replacement system according to the present invention allows the safe and easy removal or reattachment of components such as integrated circuits on circuit boards using focused hot air. The system shown in FIG. 1 includes a soldering and desoldering tool 10, a circuit board holder 12, and a controller 14. Preferably, the system also includes an auxiliary preheater 16, shown in FIGS. 3–5, which is placed beneath the circuit board.

The soldering and desoldering tool 10, which is referred to below as the tool, is shown with a head 18 of the tool in a lowered position in FIG. 2. The tool 10 includes a nozzle 20 positioned on the head 18 for directing a flow of hot air over a component to be removed or reflowed. The nozzle 20 is removably connected to the head 18 by a connection and release mechanism 26 which will be described in further detail below with respect to FIGS. 7 and 8. The head 18 is connected to a base 22 of the tool 10 by an arm 24 which allows the head to be moved between the two positions shown in FIGS. 1 and 2. A fan 32 as illustrated in the base 22 is positioned for directing air through the arm 24 and the head 18 to the nozzle 20. The head 18 includes a heating element illustrated as reference numeral 46, which heats the air for heating of the component to be removed or reflowed.

Figure 1:
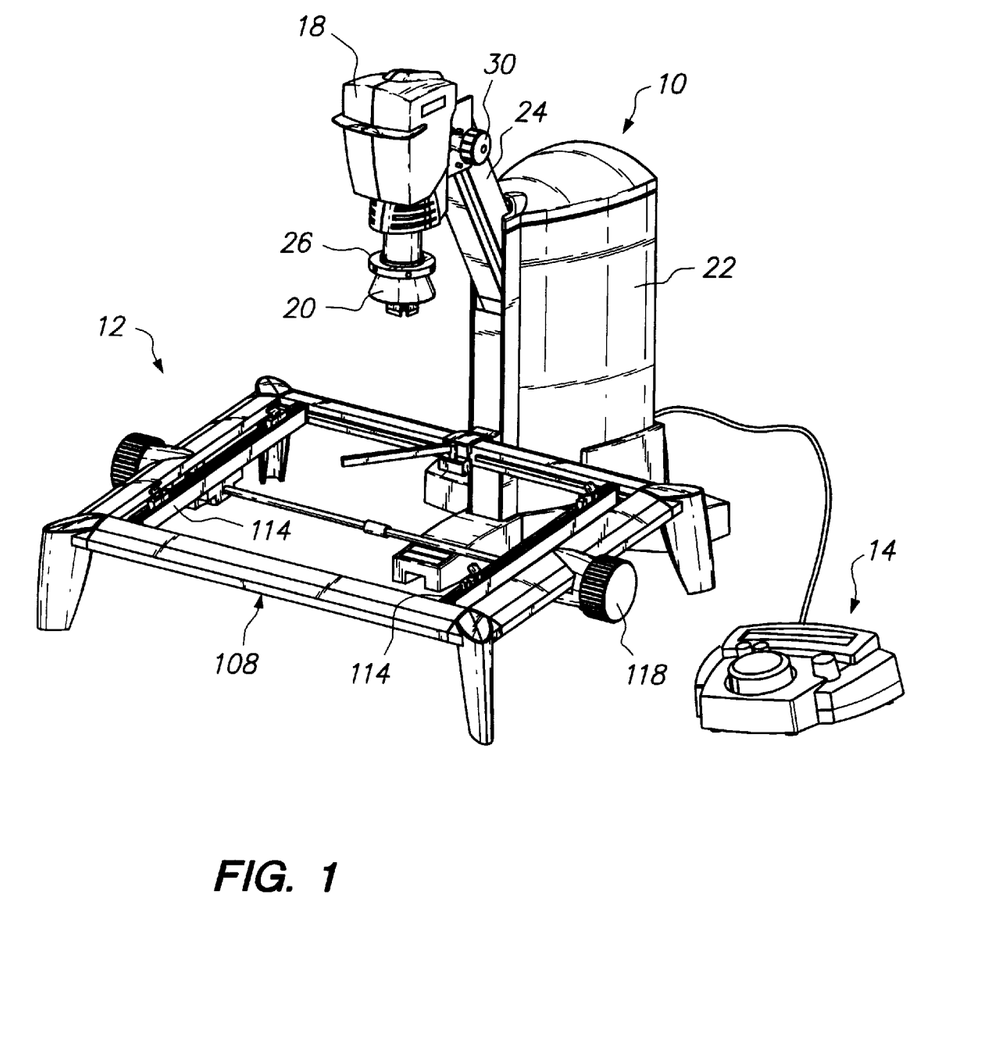
FIG. 1 is a perspective view of a chip removal and replacement system according to the present invention.
Figure 2:
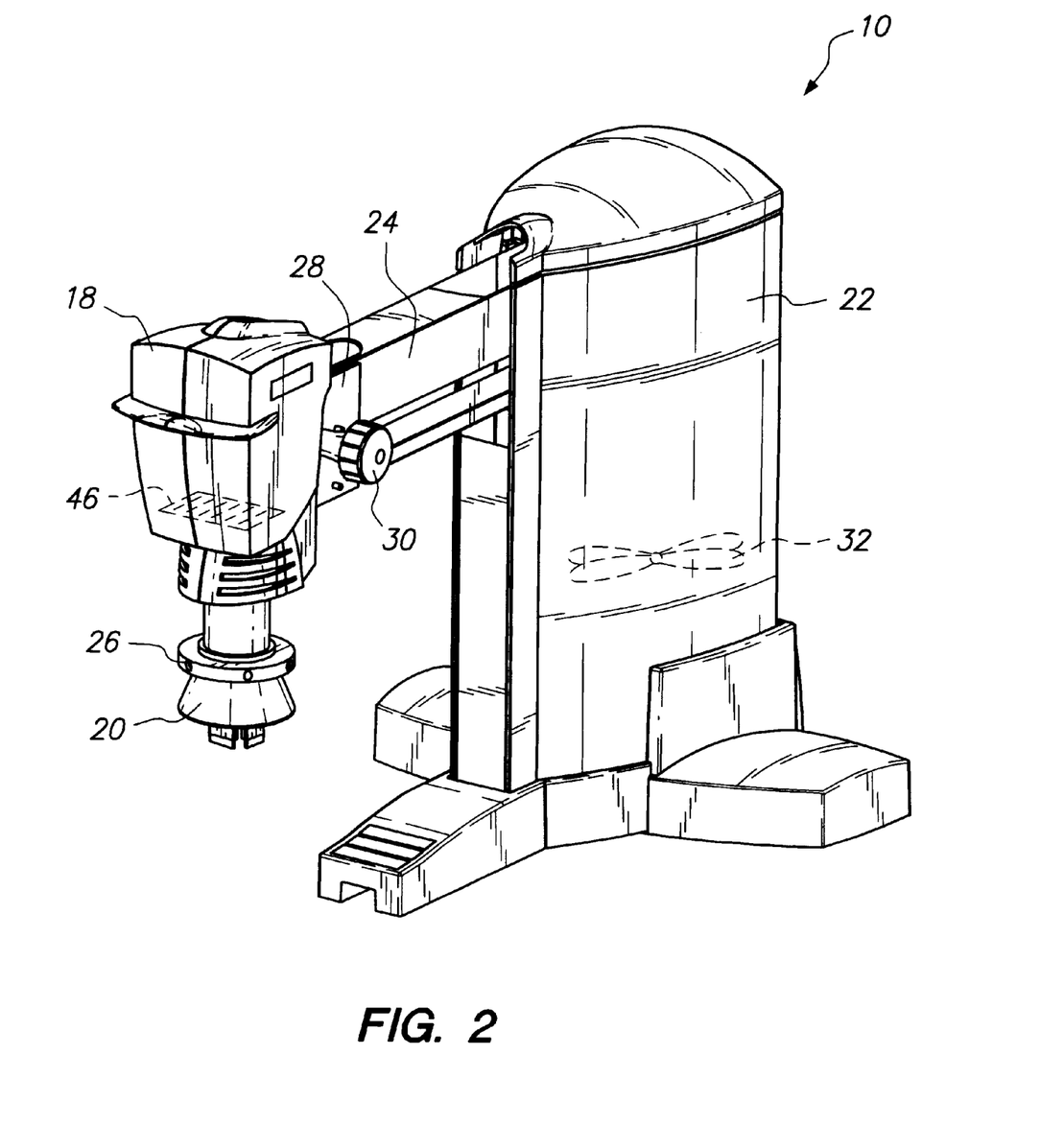
FIG. 2 is a perspective view of the desoldering tool of FIG. 1 with an arm of the tool in a lowered position.

The arm 24 is designed as a four bar linkage which allows the head 18 to move upward and back toward the base 22 so that the tool 10 is more compact in the non-use storage position illustrated in FIG. 1. The head 18 is connected to the arm 24 by a Z-axis adjustment mechanism 28 for fine Z-axis adjustment including adjustment knobs 30 on both sides of the head. The adjustment knobs 30 engage teeth (not shown) on a back side of the head 18 such that rotation of the knobs 30 raises and lowers the head on the arm 24. The Z-axis adjustment mechanism 28 allows the nozzle 20 to be manually adjusted to a position adjacent a component to be removed. Additional adjustment of the nozzle 20 is provided by rotation of the nozzle connection and release mechanism 26 to rotationally align the nozzle with the component to be removed.

Figure 3:
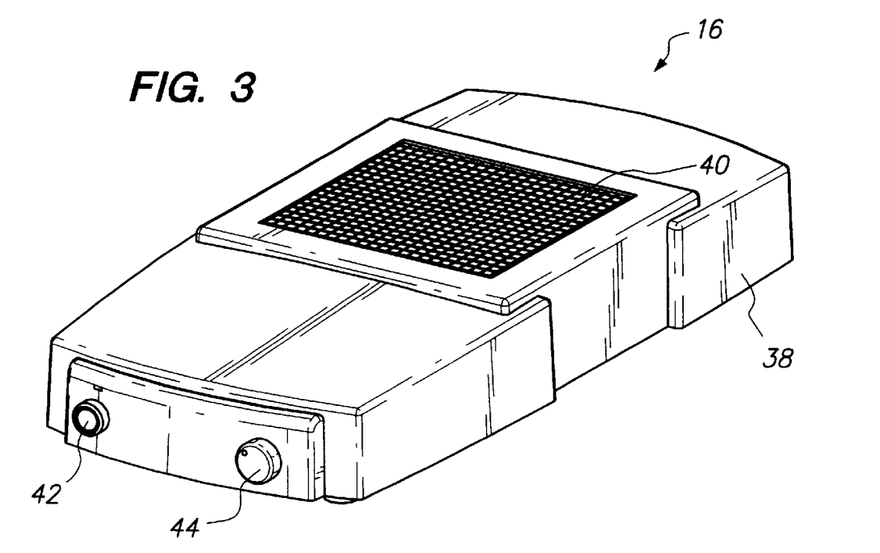
FIG. 3 is a perspective view of a auxiliary preheater for use with the system of FIG. 1.
Figure 4:
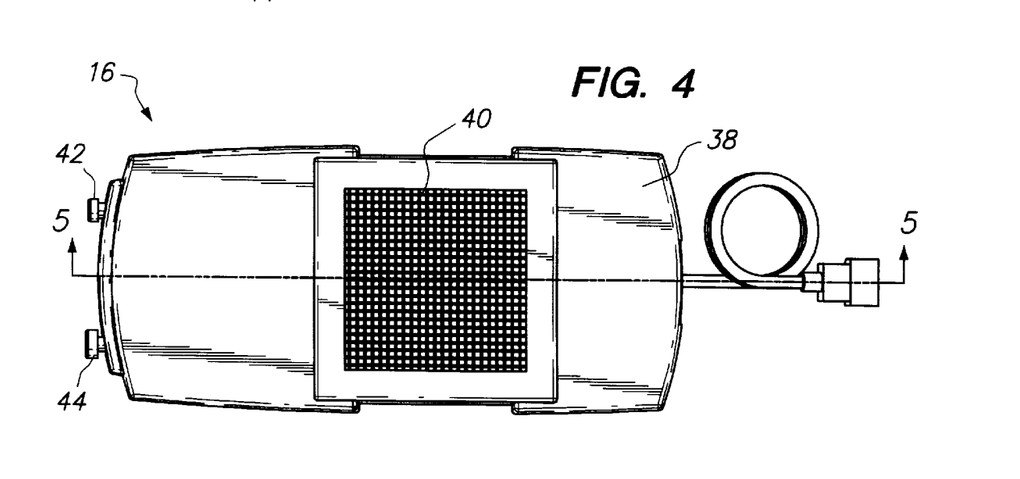
FIG. 4 is a top view of the auxiliary preheater of FIG. 3.
Figure 5:
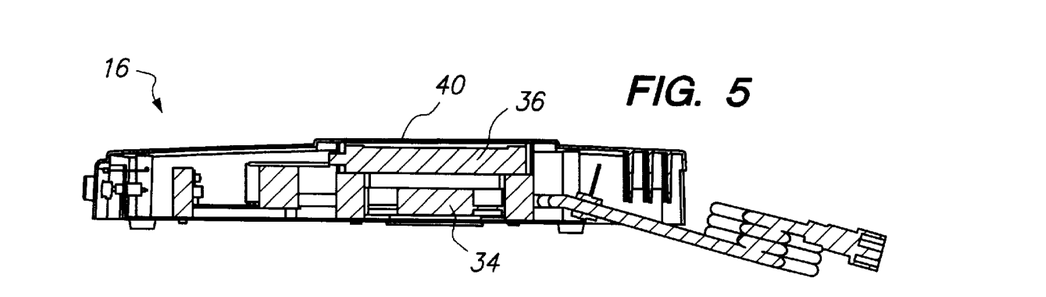
FIG. 5 is a cross sectional view of the auxiliary preheater taken along line 5—5 of FIG. 4.

FIGS. 3–5 illustrate a auxiliary preheater 16 which is configured to fit below the circuit board holder 12 and blow warm air up around the circuit board. The auxiliary preheater includes a variable speed fan 34 which blows air over a constant temperature heating element 36. The heating element 36 is preferably a ceramic positive temperature coefficient (PTC) heater having a plurality of heat exchange fins through which air is blown. The PTC heater provides has a fixed maximum temperature. The PTC heater provides an advantage over prior art heaters by preventing overheating and the associated damage to circuit boards and components which may occur with known heaters if not carefully controlled. One example of a PTC heating element is available from David+Baader, GmbH of Germany and is identified as a finned resistor heating element Type HR 01. This heating element operates at 1500 W, with an operating voltage range of 100V to 120V, and provides a maximum surface temperature of 230° C. with no air flow.

The auxiliary preheater 16 includes a housing 38 with a screen 40 over the heating element 36. The housing 38 includes an on/off switch 42 and a fan speed control 44. Although the auxiliary preheater 16 can be controlled manually, the auxiliary preheater is preferably connected to the tool 10 and is controlled by the tool controller 14. The controller 14 is able to coordinate the heating profiles of the auxiliary preheater 16 and the heater 46 in the tool 10 by controlling fan speeds and thus the rate of heat transfer by convective means rather than changing the temperatures of the heaters themselves.

Figure 6:
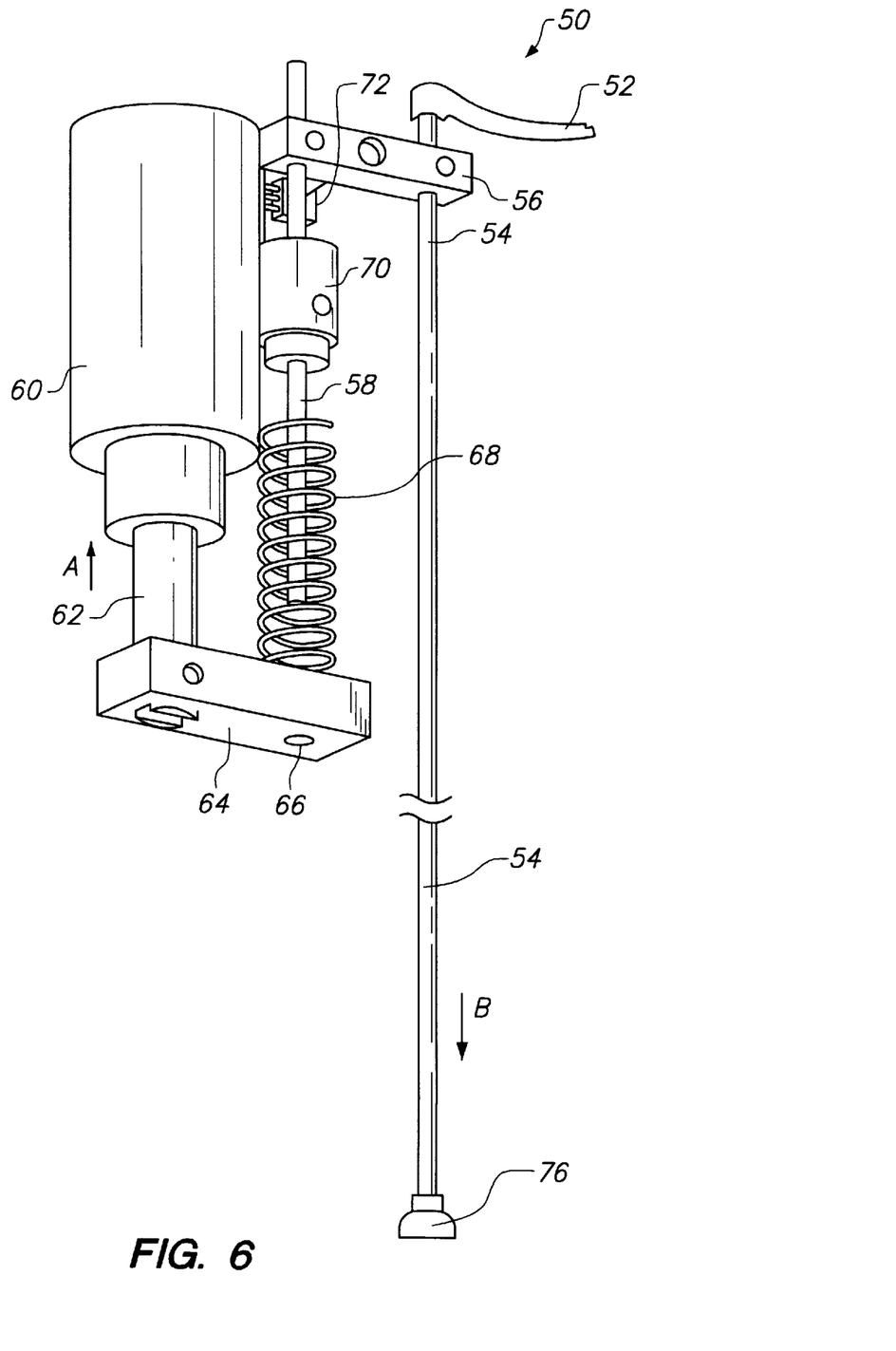
FIG. 6. is a perspective view of an automatic vacuum pickup linkage for the tool of FIG. 1.

The tool 10 is also provided with an automated vacuum system which lifts a component off of the circuit board once the solder connections have been completely melted. This automated vacuum pickup system 50 is illustrated in FIG. 6. The system 50 includes a suction inlet tube 52 which delivers suction from a vacuum source in the base 22. The suction inlet tube 52 is connected to an upper end of a vertically movable rigid suction tube 54 which extends from an interior of the tool head 18 through the heating element in the head and out of the bottom of the head in the center of the nozzle 20. The bottom end of the suction tube 54 is provided with a removable vacuum cup 76 and is positioned so that it is adjacent the top of a component when the nozzle 20 is properly adjusted for component removal. The suction tube 54 is fixed to a first plate 56 which is vertically movable and connects the suction tube 54 to a rod 58. A solenoid linear actuator 60 of the pickup system 50 is fixed in the tool head 18 and provides a vertical lifting force to lift the component off of the circuit board. A piston 62 of the linear actuator 60 is connected to a second plate 64 of the pickup system 50. The second plate 64 is provided with an opening 66 which allows the rod 58 to pass through the plate.

In operation, once the tool 10 has been positioned with the nozzle 20 adjacent a component to be removed the vacuum source is activated to create a suction in the suction tube 54 causing the component to be grasped by the vacuum cup 72. After the suction is applied, the solenoid linear actuator 60 is activated moving the second plate 64 upward in the direction of the arrow A. Since the component is still connected to the circuit board by the solder connections which have not yet been melted, the component applies a downward force in the direction of the arrow B on the suction tube 54. This causes the spring 68 to be compressed between the second plate 64 and a sensor member 70 on the rod 58. The spring 68 continues to apply a constant upward force on the suction tube 54, and thus, the component until the component is released from the circuit board. The force applied by the spring 68 is sufficient to lift the component after the solder connections have all been melted but insufficient to lift the component before all the solder connections have been melted.

The automated vacuum pickup system 50 also includes a sensing mechanism for sensing when the component has been removed from the circuit board. This sensing system includes a sensor member 70 on the vertically movable rod 58 and a corresponding sensing element 72 fixed in the tool head 18. When the component has been released by desoldering of all of the solder connections, the spring 68 causes the rod 58, the plate 56, and the suction tube 54 to be lifted. In the lifted position, the sensor member 70 on the rod 58 is adjacent the sensing element 72 causing a signal to be sent to the controller 14 indicating that the component has been removed. The heating system is then automatically shut off.

Figure 7:
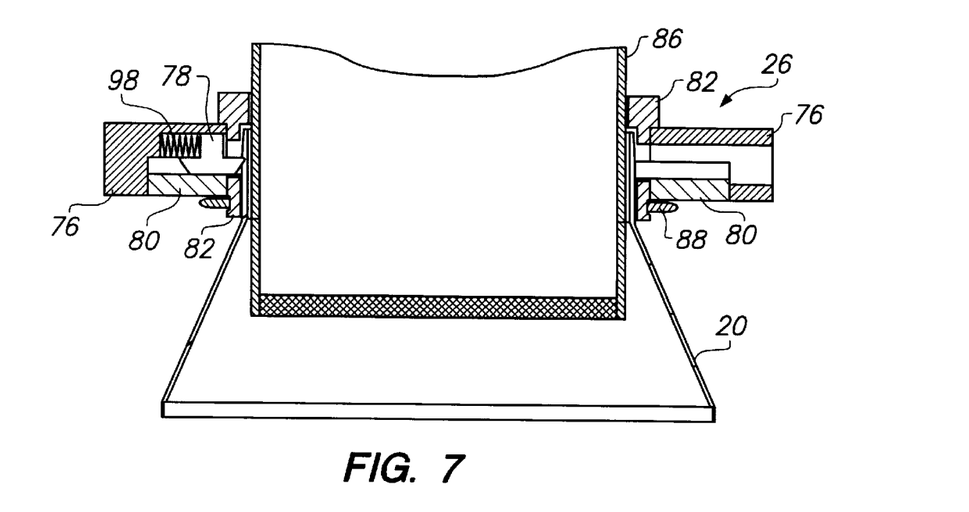
FIG. 7 is a side cross sectional view of the nozzle connection and release system of the tool of FIG. 1.
Figure 8:
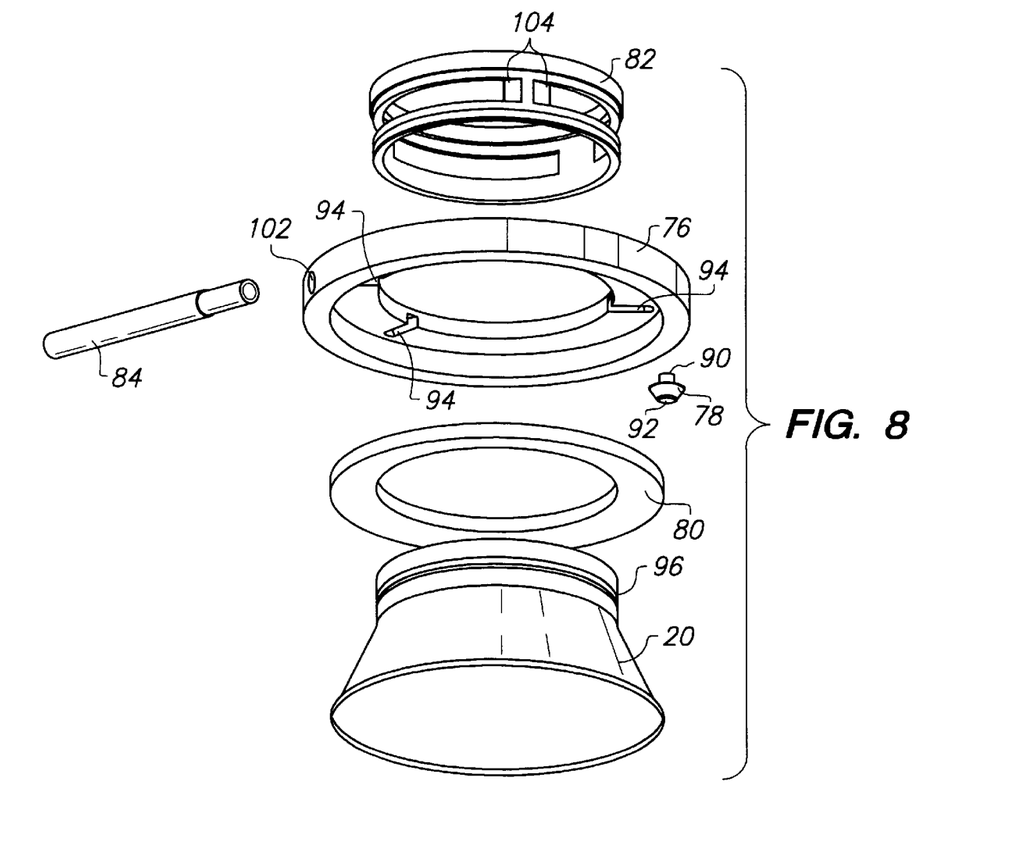
FIG. 8 is an exploded view of the nozzle connection release system of FIG. 7.

FIGS. 7 and 8 illustrate the nozzle connection and release mechanism 26 which allows different nozzles 20 to be snapped-in, rotated for positioning, and released without touching the hot nozzle. The elements of the connection and release mechanism 26 include a rotatable ring 76, spring biased pins 78, a retaining ring 80, a release ring 82, and a handle 84. As shown in FIG. 7, an upper end of the release ring 82 is fixed to an exterior of the cylindrical heater housing 86. A space is provided between the lower end of the release ring 82 and the housing 86 for inserting the upper end of the nozzle 20. A rotatable portion of the nozzle connection and release mechanism 26 includes the rotatable ring 76 with spring biased pins 78 and the retaining ring 80. The rotatable portion is placed over the fixed release ring 82 and secured by a C-clip 88, shown in FIG. 7.

According to the embodiment illustrated, three spring biased pins 78 provide the snap-in connection by snapping into a circumferential groove 96 in the nozzle 20. However, other numbers or shapes of spring biased members may also be used. The three pins 78 each include a stem 90 which is sized to be received in the three slots 94 in the rotatable ring 76, and a head 92 which has a disk shape with beveled edges. A spring 98, as shown in FIG. 7, biases the pins 78 inward toward the groove 96 in the nozzle 20.

The handle 84 fits into an opening 102 in the rotatable ring 76 and is used to rotate the nozzle 20 to adjust the orientation of the nozzle to match a component being removed or replaced. The handle 84 is also used to rotate the ring 76 to release the nozzle 20 from the tool head. Rotation of the ring 76 by the handle 84 until it stops causes the heads 92 of the pins to each engage one of the six ramps 104 on the release ring causing the pins to be disengaged from the groove 96 in the nozzle allowing the nozzle to be released from the nozzle connection and release mechanism 26.

According to one embodiment of the invention, the nozzles 20 may be coded for the size and type of component which is to be removed. The nozzles 20 may include a coded portion which is recognized by the desoldering tool upon insertion. The coded portion may be an electronically readable code, a mechanically readable code, or other code. When the coded nozzles are inserted into the tool 10, the tool reads the code and automatically sets a temperature and an airflow profile of the fan based on the recognition of the coded portion of the nozzle by the tool.

Figure 9:
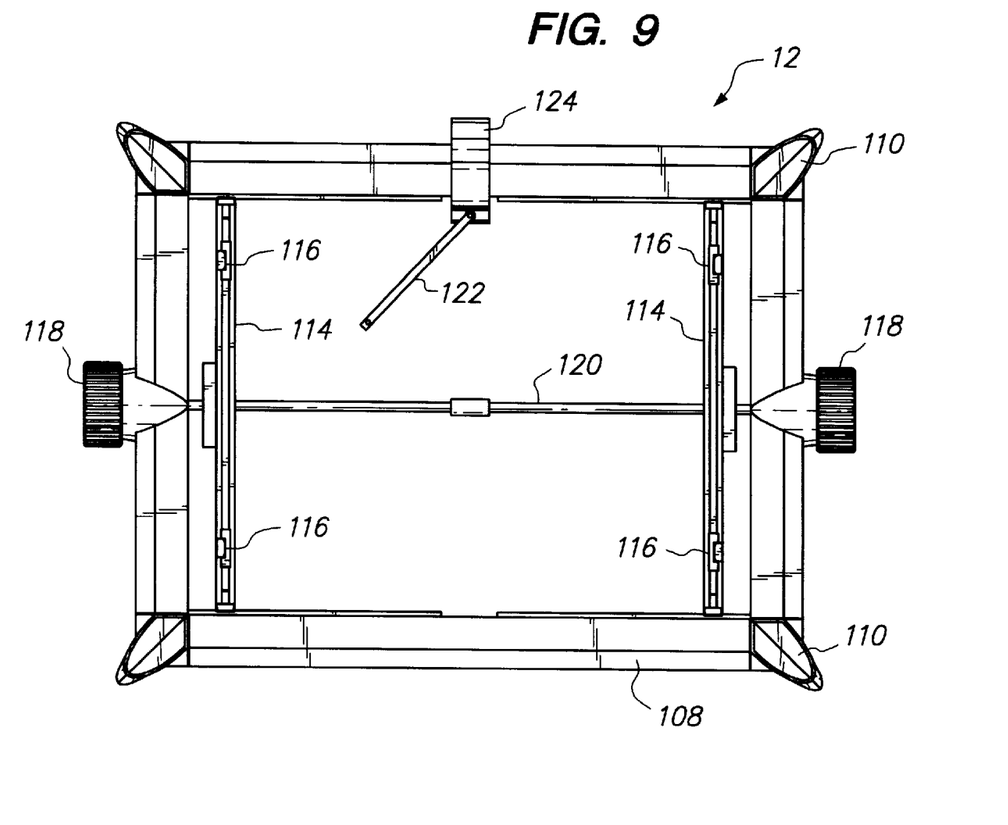
FIG. 9 is a top view of the circuit board holder.
Figure 10:
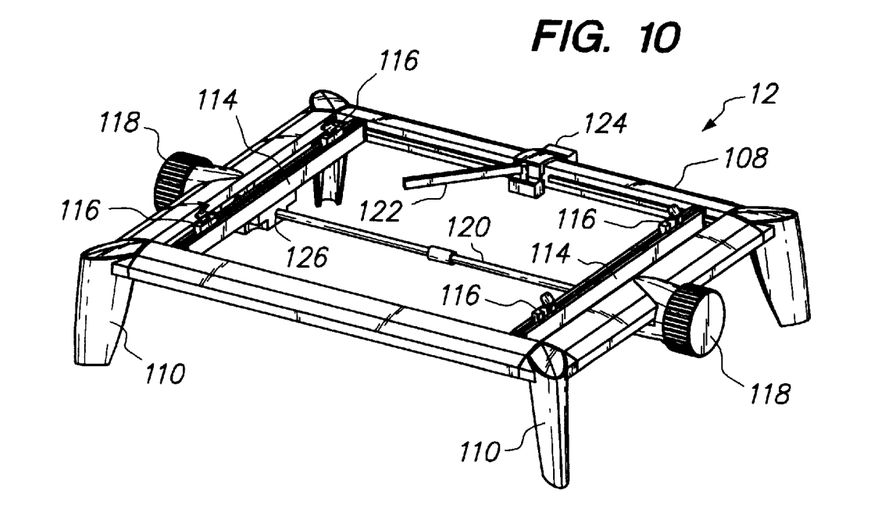
FIG. 10 is a perspective view of the circuit board holder of FIG. 9.
Figure 11:
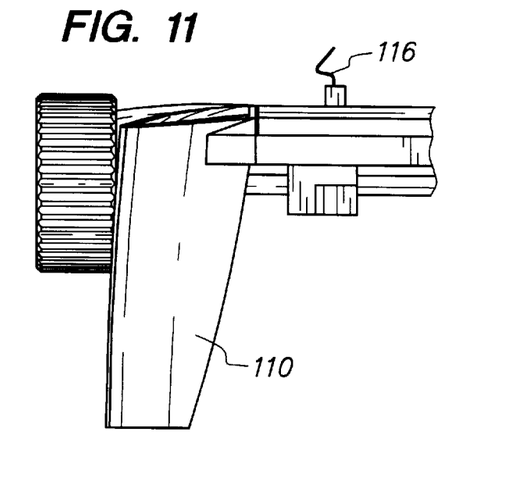
FIG. 11 is an enlarged side view of a portion of the circuit board holder showing one of the movable clips.

The circuit board holder 12, illustrated in FIGS. 9 and 10, allows a printed circuit board to be easily fixed in place for removal or replacement of components without contacting any of the components. The board holder 12 includes a frame 108 having four legs 110 and two sliding parallel rails 114 which move toward and away from each other to accommodate the printed circuit board. Each of the rails 114 is provided with two sliding clips 116 which are configured to receive an edge of the circuit board. An enlarged side view of one of the clips 116 is shown in FIG. 11. The clips 116 are preferably formed of a flexible material allowing the clips to flex outward to securely retain a circuit board.

The circuit board holder also includes a threaded rod 120 which extends through threaded bores 126 in each of the sliding rails 114. A wheel 118 is connected to the threaded rod 120 at each end. The circuit board holder 12 is provided with an optional sliding indicator 124 having a pivoting board support arm 122.

In use, the wheel 118 is rotated so that the rails 114 are spaced to accommodate the size of the circuit board to be reworked. The clips 116 are then moved along the rails 114 to a position at which they can grasp the edge of the circuit board without contacting any components on the board. The wheel 118 is then rotated to tighten the clips 116 onto the circuit board. The clips 116 flex to accommodate thermal expansion of the circuit board during the rework process. The circuit board holder 12 can accommodate circuit boards of odd shapes such as L-shaped boards by adjusting the positions of the clips 116.

Figures 12, 13:
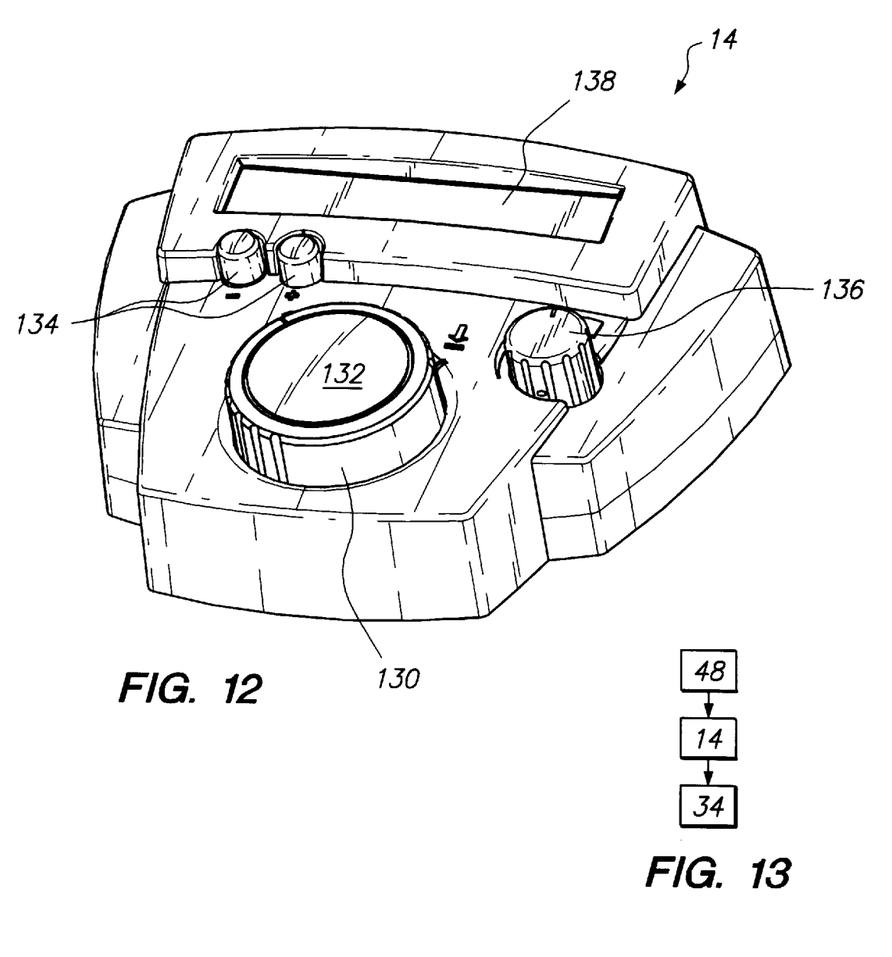
FIG. 12 is a perspective view of the system controller.
FIG. 13 is a block diagram of the controller operation.

FIG. 12 illustrates the controller 14 for controlling the operation of the tool 10 and optionally the auxiliary preheater 16. The controller 14 includes a mode selector knob 130 for selecting removal mode or reflow mode. In the center of the mode selector knob 130 is a start/stop button 132. The controller also includes time control up/down buttons 134 and an airflow control knob 136 which controls the fan speed. A display screen 138 or LCD displays time and temperature information. Time is displayed on the screen 138 and will count either up or down depending on the mode of operation. In the removal mode, the display time will count up and in the reflow mode the display time will count down. The time control buttons 134 allow the user to adjust the time for the reflow mode only.

The air temperature exiting the nozzle 20 is preferably sensed by a temperature sensor 48 which is positioned either on the circuit board or within the nozzle 20, preferably at a bottom edge of the nozzle. The temperature sensor provides a signal to the controller 14 and the controller displays the temperature on the screen 138. According to one embodiment, the controller 14 may automatically control the fan speed of fan 34 based on the information provided by the temperature sensor 48, as schematically shown in FIG.

The operation of the system in the component removal mode is as follows. The vacuum cup 76 is installed on the suction tube 54 as shown in FIG. 6 for grasping of the removed component. A removal nozzle 20 is chosen that corresponds to the component to be removed and the nozzle is snapped onto the head 18 of the tool 10. The circuit board is placed in the circuit board holder 12, or alternatively on a conventional workstand. The head 18 is lowered until it locks in the down position illustrated in FIG. 2. The board holder 12 or workstand is manipulated until the component to be removed is centered below the nozzle 20 so that the leads do not hit the nozzle when the component is lifted from the board. The nozzle 20 is rotated to a proper orientation by the handle 84. The Z-axis adjustment knob 30 is then used to lower the reflow head 18 until the nozzle completely encapsulates the component. Preferably, the nozzle 20 remains about 1 mm above the component leads and does not come into contact with the component. The mode selector knob 130 is placed in the removal position, the airflow control 136 is adjusted for the particular application, and the start button 132 is pressed.

Once the setup is complete for the removal mode and the start button 132 has been pressed the system will proceed to automatically remove the component. If the auxiliary preheater 16 is connected, the auxiliary preheater will start automatically. Hot air will begin to flow from the nozzle 20 and the timer will begin counting up. When the solder connections have been melted the component will be automatically lifted from the circuit board, the auxiliary preheater will shut down, and hot air from the tool will automatically stop. The removal time will be stored for use in the subsequent reflow cycle. The vacuum cup 72 will continue to hold the component until the head 18 is raised and the start/stop button 132 is pressed. Preferably, a scoop or tray is used to receive the hot component when the component is released from the vacuum cup 72. Removal is now complete.

In the reflow or reattachment mode the attachment site on the circuit board is prepared and the component to be attached is placed on the circuit board. The mode selector knob 130 is rotated to the reflow mode causing the suction tube 54 to automatically raise so that it will not cause any obstruction during reflow. The head 18 is lowered to the down position, the nozzle 20 is rotated with the handle 84, and the Z-axis adjustment knobs 30 are used for fine adjustment of the vertical position of the nozzle. As in the removal mode, the nozzle 20 is preferably positioned about 1 mm from the leads and no part of the nozzle should be in contact with the component. The time recorded during the previous removal cycle is recorded on the controller display screen 138. Once the start button 132 is depressed, the hot air cycle will begin and the timer will count down to zero and then will shut off.

The system will operate at a set temperature, which is preferably between about 300° C. and 400° C. However, the system may be calibrated by the user to other temperatures depending on the application. During the removal or reflow process, the temperature may be controlled by adjustment of the airflow control 136.

While the invention has been described in detail with reference to the preferred embodiments thereof, it will be apparent to one skilled in the art that various changes and modifications can be made and equivalents employed, without departing from the present invention.

What is claimed is:

1. A desoldering tool comprising:

a tool head;

a heating element within the tool head;

a fan for passing a gas over the heating element to provide a heated gas stream for desoldering of components from a circuit board;

a nozzle removably connected to the tool head for directing the heated gas stream to the component to be removed;

a nozzle connection on the tool head for receiving the nozzle, the nozzle connection including at least one spring element for forming a snap-in connection with the nozzle; and a nozzle release mechanism including a rotatable member which rotates about the axis of the nozzle to disengage the at least one spring element and release the nozzle.

2. The desoldering tool of claim 1, wherein the nozzle connection includes a plurality of spring biased pin members which snap into a corresponding groove in the nozzle.

3. The desoldering tool of claim 2, wherein the nozzle release mechanism includes a plurality of ramps which contact and release the pin members from the groove in the nozzle.

4. The desoldering tool of claim 3, wherein the pin members are positioned in the rotatable member and the ramps are fixed on the tool head.

* * * * *